(12) United States Patent  
Ueki

(10) Patent No.: US 6,816,527 B2  
(45) Date of Patent: Nov. 9, 2004

(54) SURFACE EMITTING SEMICONDUCTOR LASER

(75) Inventor: Nobuaki Ueki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/377,767

(22) Filed: Mar. 4, 2003

(65) Prior Publication Data

US 2004/0028103 A1 Feb. 12, 2004

(30) Foreign Application Priority Data

Jul. 29, 2002 (JP) ........................................ 2002-219026

(51) Int. Cl.$^7$ .............................................. H01S 5/00
(52) U.S. Cl. ........................................................ 372/46
(58) Field of Search .............................. 372/43–50, 96

(56) References Cited

U.S. PATENT DOCUMENTS 5,557,627 A * 9/1996 Schneider et al. ............ 372/46
5,940,422 A 8/1999 Johnson ........................ 372/45
5,963,576 A 10/1999 Claisse et al. ................ 372/96

FOREIGN PATENT DOCUMENTS

JP A 2001-210908 8/2001

OTHER PUBLICATIONS

Stolen et al., "Optical fiber modes using stimulated four photon mixing", Applied Optics, vol. 15, No. 1, pp. 239–243, 1976, Jan.

* cited by examiner

Primary Examiner—Quyen Leung  
(74) Attorney, Agent, or Firm—Oliff & Berridge, PLC

(57) ABSTRACT

A surface emitting semiconductor laser includes a substrate on which a resonator is formed, the resonator including a lower reflection mirror, an active region, and an upper reflection mirror, a metal layer that is provided on the upper reflection mirror and has a first aperture that defines an outgoing region of laser light generated in the active region, and an optical confinement region that is provided between the metal layer and the lower reflection mirror and has a second aperture that defines a light emission region of the laser light. The second aperture has a diameter equal to or greater than 12 $\mu$m, and the first aperture has a diameter that is 1 to 5 $\mu$m smaller than that of the second aperture. The laser light emitted from the emitting region has a multimode including multiple orders selected within a predetermined wavelength range.

20 Claims, 13 Drawing Sheets

$D_1$  8 μm  9 μm  10 μm  12 μm  14 μm  16 μm $D_2$ = 12 μmφ

$D_2$ = 15 μmφ

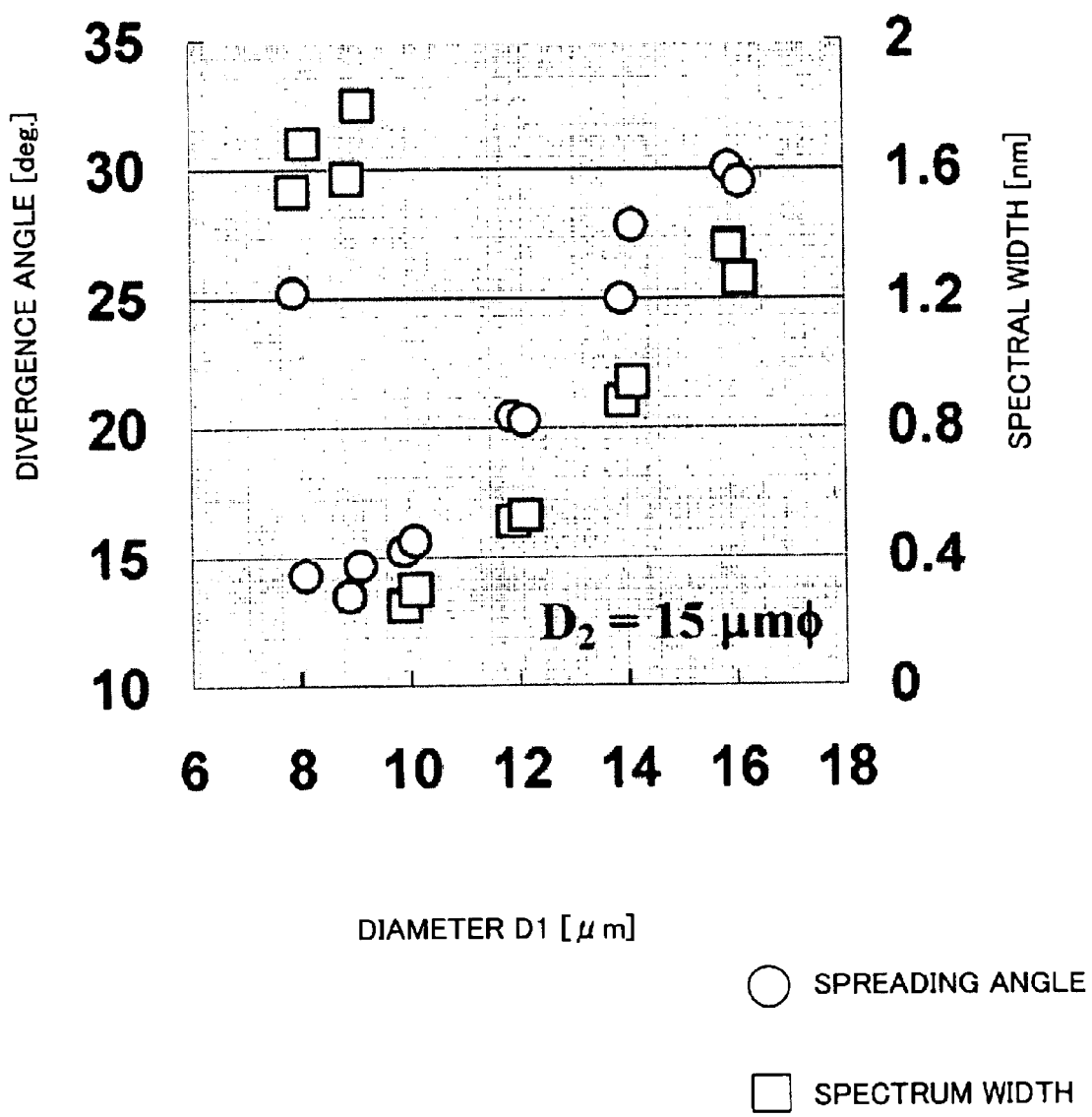

SURFACE EMITTING SEMICONDUCTOR LASER

BACKGROUND OF THE INVENTION

1. Field of the Invention

The present invention relates to a surface emitting semiconductor laser used as a source for optical information processing, and more particularly, to a surface emitting semiconductor layer used as an optical source of an optical data storage device and optical communications.

2. Description of the Related Art

Recently, there has been an increased demand for a surface emitting semiconductor laser capable of easily realizing an array of sources in the technical fields of optical communications and optical interconnections. Such a laser is also called vertical-cavity surface-emitting laser diode (VCSEL).

It is known that VCSEL has advantages of low threshold current, small power consumption, easy formation of a circular spot and wafer-level evaluation. On the other hand, it is known that VCSEL has disadvantages due to a small volume of the active region resulting from the low threshold current. More particularly, VCSEL has a high device resistance as much as a few tens to a few hundreds of ohms and difficulty in power up. For example, it is difficult to obtain high power as much as 10 mW by the device alone.

A low-cost multimode optical fiber, which is typically a plastic optical fiber (POF), has been developed, and attention to short-distance optical communications (as short as a few meters to a few hundreds meters) has been occupied. Long-distance optical communications employ the combination of a single-mode optical fiber and an edge-emitting laser diode having a comparatively long wavelength of, for example, 1.31 $\mu$m or 1.55 $\mu$m. However, these devices are expensive and are unsuitable for local-area communications that require low costs.

The optical source for the multimode optical fiber is required to be less expensive and free of a particular optical system and driving system. The surface emitting laser satisfies these requirements and is one of the good candidates as the optical source for the multimode optical fiber.

A typical VCSEL that is available in the market is of so-called proton implantation type that utilizes a thermal lens effect in which a slight heat-based difference in the refractive index between the current passage region and the peripheral region thereof. The size or diameter of the non-proton-implanted region or the current passage region is set equal to ten to a few tens of micrometers for laser oscillation. However, this has disadvantages in that the light-emission efficiency is low because of weak current narrowing and the threshold current is high. Further, the device characteristics are liable to be degraded because of large heat generation, and the frequency response in the absence of the bias voltage is not good. The proton-implanted type VCSEL is called gain waveguide structure in structural categorization.

Selective oxidization VCSEL has an intentionally formed distribution of the refractive index for optical confinement and is therefore categorized into the refractive index waveguide structure. In the selective oxidization VCSEL, part of a semiconductor multilayer reflection layer in the vicinity of the active region is selectively oxidized to thus define a refractive index waveguide path. The region thus defined has the strong optical confinement effect, and therefore realizes high efficiency and low threshold current. In addition, it is possible to easily fabricate a VCSEL having a good frequency response in which the modulation bandwidth (3 dB down cutoff frequency) ranges from a few to a few tens of GHz.

Although VCSEL has many advantages mentioned above, various high-order oscillation modes may occur by increasing the diameter of the light emitting portion over 10 $\mu$m for the purpose of power up, and exhibits a so-called multimode oscillation characteristic. If the spectral width spreads over the given range in the multimode oscillation, increased attenuation of light develops due to the mode dispersion characteristic of the optical fiber. Also, change of the amount of injection current or ambient temperature may cause lateral mode instability of mode, so that mode dispersion noise is liable to take place. Furthermore, increasing of beam divergence angle may degrade the coupling efficiency with the optical fiber.

The mode characteristic may be improved by a method of narrowing the diameter of the light emission region (typically smaller than 4 $\mu$m) and restricting the oscillation to only the fundamental (zeroth-order) transverse mode of the smallest order. However, the method encounters a problem such that the device resistance is high and power up is thus unexpected.

It is required to provide tradeoff solving means for stabilizing the transverse mode that is essential to prevent attenuation in optical coupling with the optical fiber, reducing the beam divergence angle and resistance, and powering up without losing the features of the selective oxidization VCSEL of high emission efficiency and good frequency response.

There are many proposed VCSELs intended to control the oscillation mode. For example, U.S. Pat. No. 5,940,422 describes a VCSEL with a mode control using two regions having different film thicknesses. This proposal defines a film thickness equal to ¼ between the oscillation facilitating region and oscillation suppressing region.

U.S. Pat. No. 5,963,576 discloses a VCSEL having a ring-shaped waveguide path. A circular recess is formed on the top surface of a post, and a ring-shaped light emission region is provided around the recess.

Japanese Unexamined Patent Publication No. 2001-210908 discloses a single-transverse-mode semiconductor laser having a current supply path having a diameter of 10 $\mu$m or greater and making a light emission window smaller than the diameter of the current supply path.

However, none of the proposals meet the aforementioned requirements of the optical source for the multimode optical fiber. That is, a laser device with a small beam divergence angle, low resistance, high power, high efficiency and high frequency response has not yet been realized while the stability of the transverse mode is maintained.

SUMMARY OF THE INVENTION

The present invention has been made in view of the above circumstances and provides a surface emitting semiconductor laser in which the above disadvantages are eliminated.

According to an aspect of the present invention, the surface emitting semiconductor laser has: a substrate on which a resonator is formed, the resonator including a lower reflection mirror, an active region, and an upper reflection mirror; a metal layer that is provided on the upper reflection mirror and has a first aperture that defines an outgoing region of laser light generated in the active region; and an optical confinement region that is provided between the metal layer and the lower reflection mirror and has a second aperture that defines a light emission region of the laser light, the second aperture having a diameter equal to or greater than 12 µm, and the first aperture having a diameter that is 1 to 5 µm smaller than that of the second aperture, the laser light emitted from the light emission region having a multimode including multiple orders selected within a predetermined wavelength range.

According to another aspect of the present invention, the surface emitting semiconductor laser has: a substrate; a first semiconductor reflection layer of a first conduction type provided on the substrate; an active region for generating laser light provided on the first semiconductor reflection layer; a second semiconductor reflection layer of a second conduction type provided on the active region; a metal layer that is provided on the second semiconductor reflection layer and has an aperture via which the laser light goes out; and a current narrowing region that is interposed between the first and second reflection layers and a conductive portion surrounded by a high-resistance portion, the aperture of the metal layer being smaller than the conductive portion of the current narrowing region, the aperture of the metal layer and the conductive portion of the current narrowing region having sizes that allows the laser light of multimode emitted via the aperture of the metal layer, the multimode containing, in addition to an order of interest, at most two orders other than the order of interest generating a light output larger than those of other orders within a range from a maximum output level of laser light of the order of interest to a level that is 20 dB lower than the maximum output level.

According to yet another aspect of the present invention, the surface emitting semiconductor laser has: a substrate; a first semiconductor reflection layer of a first conduction type provided on the substrate; an active region that is provided on the first semiconductor reflection layer and generates laser light; a second semiconductor reflection layer of a second conduction type provided on the active region; a metal layer that is provided on the second semiconductor reflection layer and has an aperture via which the laser light goes out; and a current narrowing region that is provided between the first and second semiconductor reflection layers and has a conductive portion surrounded by a high-resistance portion, the conductive portion having a diameter equal to or larger than 12 µm, the aperture of the metal layer having a diameter that is at least 1 µm smaller than that of the conductive portion and allowing the laser light of multimode.

BRIEF DESCRIPTION OF THE DRAWINGS

Preferred embodiments of the present invention will be described in detail based on the following figures, wherein:

FIGS. 7A and 7B are graphs showing the dependence of the aperture diameter (D1) in the beam divergence angle and the spectral width;

DESCRIPTION OF THE PREFERRED EMBODIMENTS

A description will now be given of a surface emitting semiconductor laser according to an embodiment of the present invention. The optical modes developing in the light emission region in VCSEL can be obtained by solving dispersion equations regarding the light propagation characteristics in the optical fiber. Usually, VCSEL oscillates in a linearly polarized mode. Starting with the fundamental mode (expressed as $LP_{01}$), oscillation goes on with repetitive optical splitting such as $LP_{11}$ and $LP_{21}$, and changes up to the highest-order mode optically tolerable.

The following paper reports a mode pattern (electric field intensity distribution) obtained in each mode: Applied Optics, Vol. 15, No. 1, pp. 239–243. Oscillation goes on to an $LP_{11}$ mode in which each spot of the $LP_{11}$ mode is split into two, and to an $LP_{21}$ mode in which the spot of the $LP_{01}$ mode is split into two. Then, oscillation advances to $LP_{31}$, $LP_{41}$ and $LP_{51}$ modes in which the spot of the $LP_{01}$ mode is split into six, eight and ten, respectively. For the sake of simplicity, the $LP_{01}$ mode is sometimes referred to as fundamental (zeroth order) transverse mode, $LP_{11}$ as first-order transverse mode and $LP_{21}$ as second-order transverse mode.

The oscillation modes over $LP_{21}$ have a topological feature such that spots are regularly arranged on an imaginary circle. In practical laser oscillation, there are many other oscillation modes, which are represented as $LP_{nm}$ where n is an integral equal to or larger than zero, and m is a natural number. Laser oscillation does not allow random oscillation pattern but has a repetitive pattern of centrosymmetry. Thus, principally, oscillation may be selectively caused easily in a desired mode by applying a distribution of reflectance or modulation to the light emission region in accordance with a desired mode shape.

According to one aspect of the present invention, there is provided a VCSEL having mode control based on the above consideration. A detailed description of such a VCSEL will be described below with reference to the accompanying drawings.

First, a description is given of a positional or numerical relation between an upper metal layer in which a first aperture for transverse mode control and an optical confinement region that defines a second aperture for forming the emission region.

First Embodiment

Figure 1A:
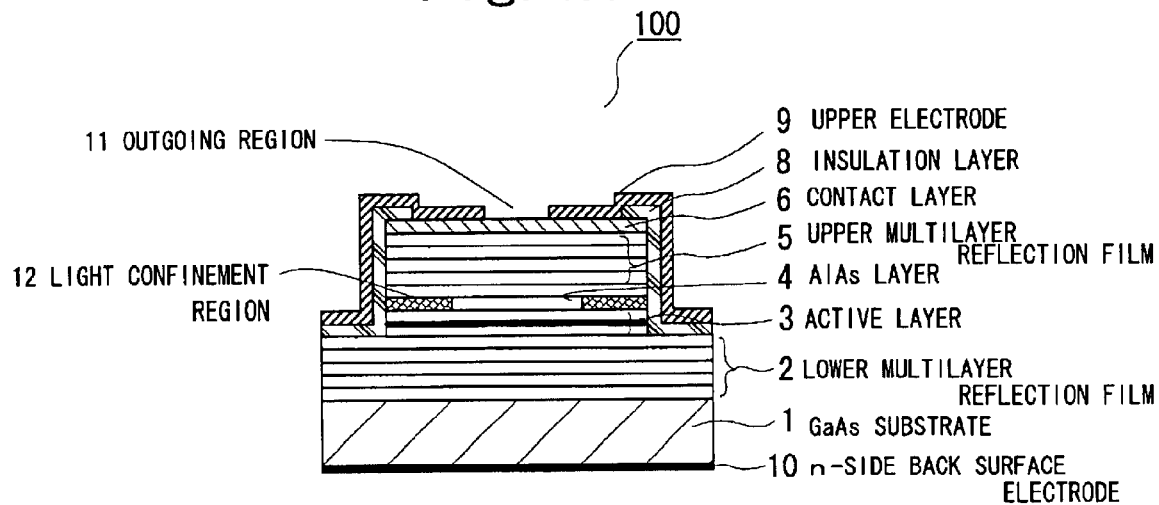
FIG. 1A is a cross-sectional view of a surface emitting semiconductor laser according to a first embodiment of the present invention, the cross-sectional view being taken along a line X1—X1 shown in FIG. 1B.
Figure 1B:
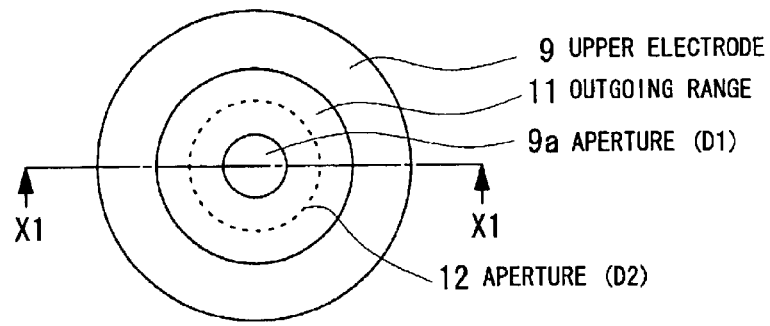
FIG. 1B is a plan view of the semiconductor laser shown in FIG. 1A.
Figure 1C:
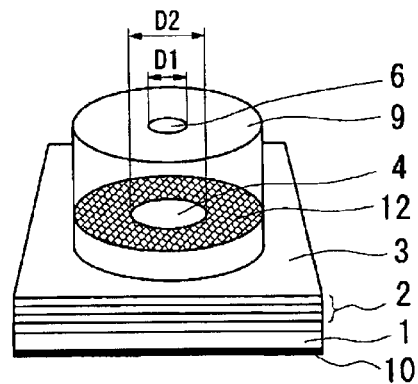
FIG. 1C is a schematic perspective view of parts of the semiconductor laser shown in FIG. 1A.

FIG. 1A is a cross-sectional view of an oxide-confined VCSEL according to a first embodiment of the present invention, FIG. 1B is a plan view of the VCSEL, and FIG. 1C is a perspective view thereof so as to see through the internal structure. More particularly, FIG. 1A is a cross-sectional view taken along a line X1—X1 shown in FIG. 1B. In FIG. 1C, some structural elements are omitted for the sake of simplicity.

The surface emitting semiconductor laser includes an n-type GaAs substrate 1, an n-type lower multilayer reflection layer 2 serving as a mirror, an undoped active region 3, a p-type AlAs layer 4, a p-type upper multilayer reflection layer 5 serving as another, a p-type contact layer 6, an interlayer insulation film 8, a p-type upper electrode 9, an n-type backside electrode 10, a light emission region 11, and an optical confinement region 12, which also serves as a current narrowing region.

A laminate of these layers is formed into a post (mesa or pillar) shape. The post structure has a cylindrical shape as shown in FIG. 1C. A circular aperture 9a for defining the light emission region 11 is formed in the center of the top portion of the upper electrode 9. The upper electrode 9 extends along the side surface of the post from the top portion thereof and reaches the post bottom. Although not illustrated, the electrode thus extending is connected to an electrode pad part to which current is supplied.

The optical confinement region 12 is formed by selectively oxidizing the AlAs layer 4 from the side surface of the post. By controlling the oxidization distance from the post sidewall, it is possible to define a desired size of the optical confinement region 12. The original AlAs layer 4 is surrounded by the optical confinement region 4a. FIG. 1C schematically depicts the relation between the diameter D1 of the aperture 9a formed in the center on the plane parallel to the substrate 1 and the inside diameter D2 of the optical confinement region 12 or the outside diameter D2 of the AlAs layer 4. As will be described later, preferably, the diameter D1 of the aperture is smaller than the inside diameter D2 of the optical confinement region 12. Preferably, the centers of the aperture 9a and the optical confinement region 12 are aligned so as to coincide with the optical axis of the post.

The upper electrode 9 may be made of Au—Zn/Au. The current narrowing region 12 is obtained by thermally oxidizing the AlAs layer that is included as the lowermost layer of the upper multilayer reflection layer 5 and is close to the active region. The AlAs layer is altered to $Al_2O_3$ by thermal oxidization and serves as a high-resistance region or insulation region. The AlAs oxide layer has a low refractive index.

The inventors conducted an experiment in which the diameter D1 of the aperture 9a was variously changed for four diameters D2 of the aperture defined by the optical confinement region 12, namely, 10 μm, 12 μm, 14 μm and 15 μm. Then, the inventors measured the L-I-V (Light output, Injected current, and Voltage applied) characteristics, oscillation spectrum, far-field pattern and frequency response.

Figure 4A:
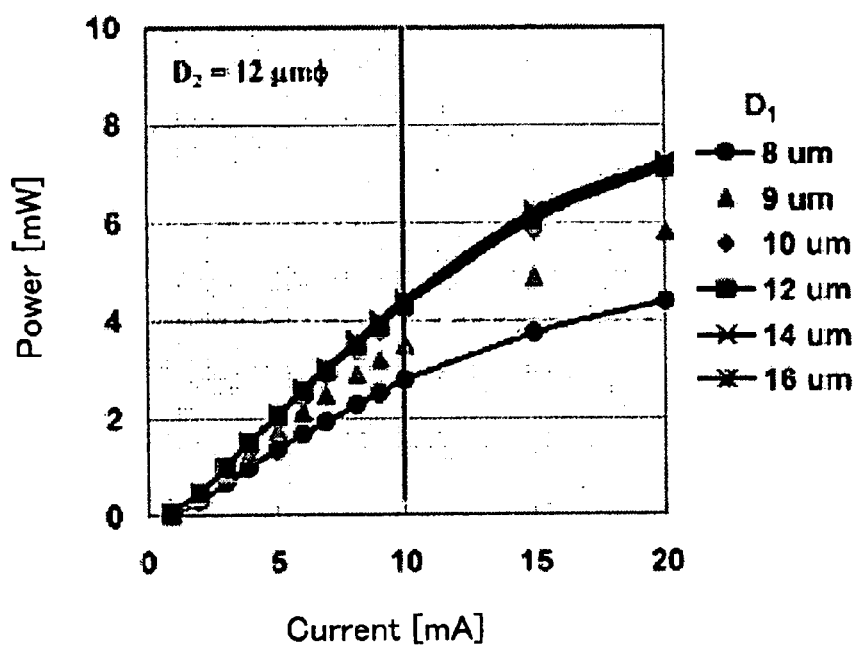
FIGS. 4A and 4B are graphs showing dependence of the diameter (D1) of an aperture in an upper electrode in the light output vs. injection current (L-I) characteristic of the surface emitting semiconductor laser according to the first embodiment of the present invention.
Figure 4B:
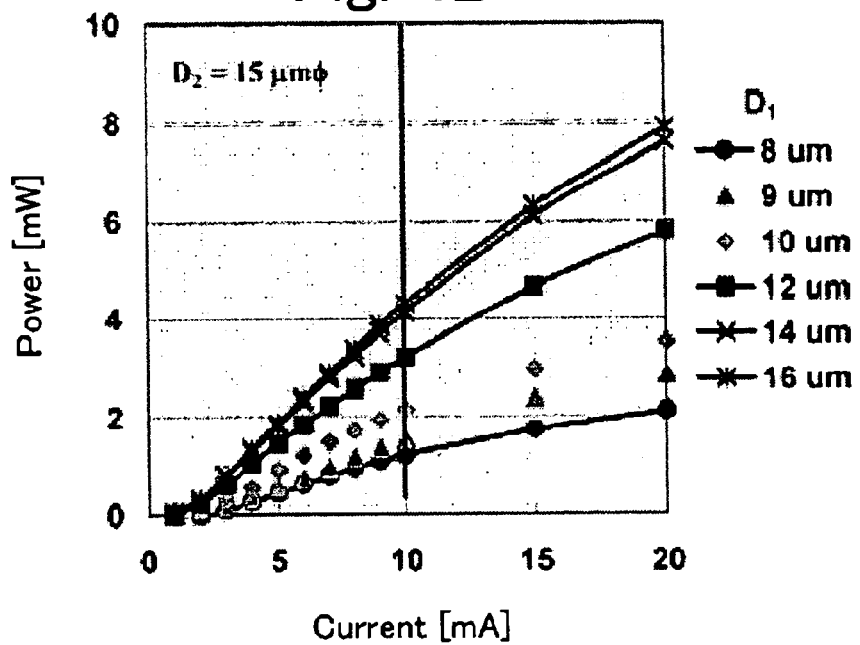

FIGS. 4A and 4B show relations between the injection current (mW) to the laser device and resultant light output (mW), and show dependence of the diameter D1 of the aperture when the aperture defined by the optical confinement region 12 has diameters D2 of 12 μm and 15 μm. It can be seen from FIGS. 4A and 4B that, as the diameter D1 decreases, the light output decreases for the same injection current. An explicit decrease of the light output occurs when the aperture diameter D1 decreases and is about 3 μm smaller than the aperture diameter D2. This maybe because an increased area of the upper electrode 9 by narrowing the diameter D1 shuts out light emitted from the light emission region in the active region 3.

Figure 5:
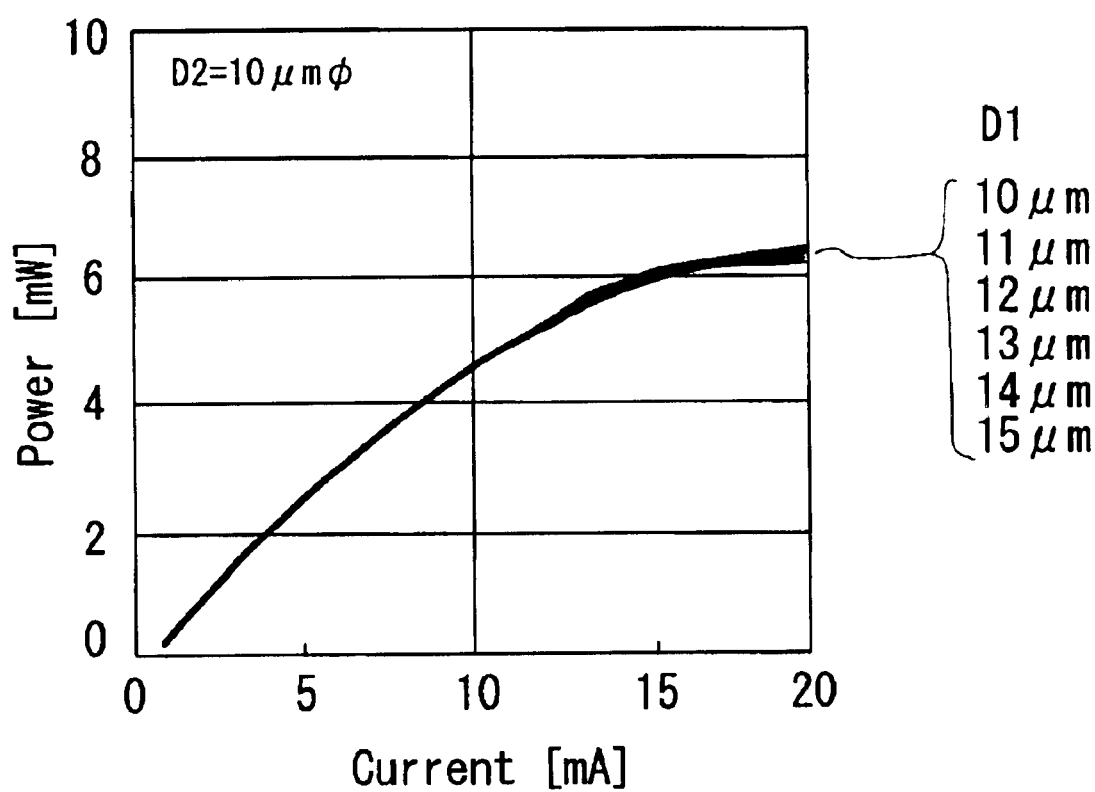
FIG. 5 is a graph showing the dependence of the diameter (D1) of an aperture in an upper electrode in the light output vs. injection current (L-I) characteristic of the surface emitting semiconductor laser according to the first embodiment of the present invention.

FIG. 5 shows a relation between the current (mA) supplied to the laser device and the resultant light output (mW). More particularly, FIG. 5 shows dependence of the diameter D1 of the aperture when the aperture of the optical confinement region 12 has a diameter D2 of 10 μm. The diameter D1 of the aperture 9 is stepwisely changed from 10 μm to 15 μm on the 1 μm bases. It can be seen from FIG. 5 that the dependence of the diameter D1 of the aperture 9a is hardly observed for the 10 μm diameter D2 of the optical confinement region 12. That is, almost the same light output is obtained regardless of the diameter D1 of the aperture 9a.

Figure 6A:
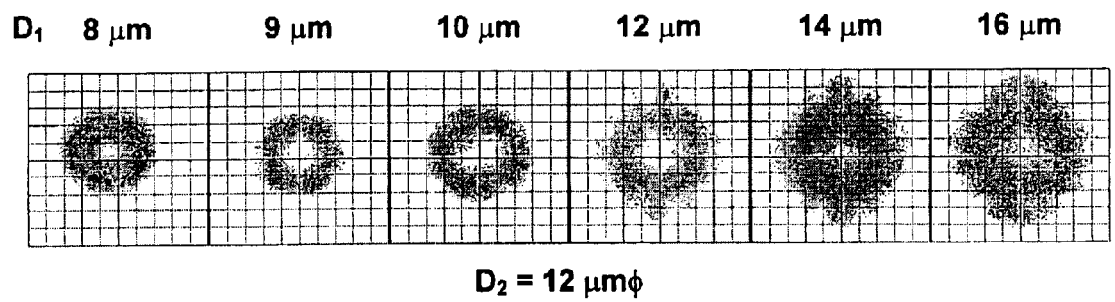
FIGS. 6A and 6B are views showing the dependence (D1) in far-field images.
Figure 6B:
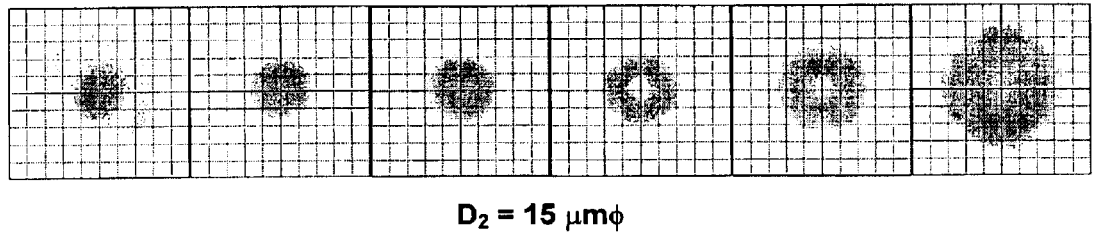

FIGS. 6A and 6B show far-field patterns observed in the case of FIG. 5. More particularly, FIG. 6A shows far-field patterns observed when the diameter D1 of the aperture 9a is changed to 8 μm, 9 μm, 10 μm, 12 μm, 14 μm, 16 μm while the diameter D2 of the aperture defined by the optical confinement region 12 is 12 μm. FIG. 6B shows far-field patterns observed when the diameter D1 of the aperture 9a is changed as mentioned above while the diameter D2 is 15 μm. In FIGS. 6A and 6B, the horizontal and vertical axes denote the beam divergence angle. The far-field patterns reflect the dependence of the aperture D1 more remarkably than the light output dependent on the current applied. That is, the beam divergence angle already has a tend to be smaller when the diameter D1 is about 1 μm smaller than the diameter D2. Although not clearly illustrated, the actual measurement results show that the far-field pattern for the 12 μm diameter D1 in the case of FIG. 6A (D2=12 μm) has a light image that is spread around the central deep image, and is broader than that obtained for a diameter D1 of 10 μm. The far-field pattern for a diameter D1 of 16 μm in the case of FIG. 6B (D2=15 μm) has an image that is spread around the central deep image and is broader than that obtained for a diameter D1 of 14 μm. It is considered that the above phenomena result from a situation in which an increased area of the upper electrode 9 by narrowing the diameter D1 shuts out light emitted from the light emission region in particular modes, and the number of oscillation modes is decreased due to suppression of oscillations in the particular modes.

The above consideration is substantiated by the results of measuring spectral widths shown in FIGS. 7A, 7B, 8A and 8B. More particularly, FIGS. 7A and 7B respectively show the experimental results obtained when the diameter D2 of the optical confinement region 12 is 12 μm and 15 μm, and FIGS. 8A and 8B respectively show the experimental results obtained when the diameter D2 of the optical confinement region 12 is 10 μm and 14 μm. In the graphs of FIGS. 7A, 7B, 8A and 8B, the horizontal axes denote the diameter D1 of the aperture 9a, and the vertical axes on the left side denote the beam divergence angle ($1/e^2$). The vertical axes on the right side denote the spectral width (full-width at half-maximum: RMS (root-means-square) value), and circular marks denote the beam divergence angle, square marks denoting the spectral width. The light output is constantly equal to 2 mW.

Figure 7A:
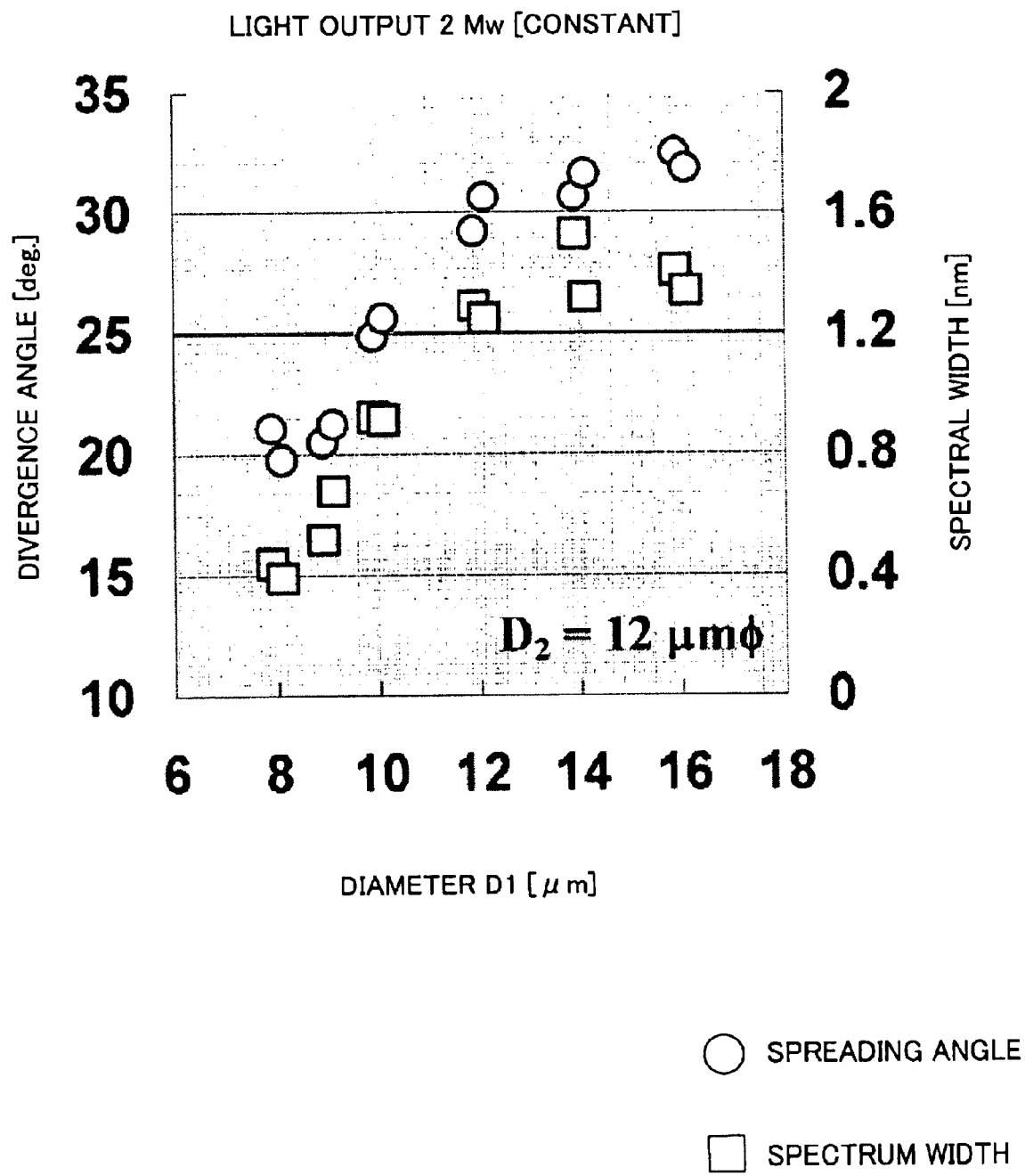

As shown in FIG. 7A, in the case where the diameter D2 of the aperture defined by the optical confinement region 12 is 12 μm, both the beam divergence angle and the spectral width decrease monotonically. As shown in FIG. 7B, in the case where the diameter D2 of the aperture defined by the optical confinement region 12 is 15 μm, both the beam divergence angle and the spectral width decrease monotonically, but the latter changes to rapid increase on the way. This may be due to the RMS measurement itself and may result from discontinuous change of the laser performance.

Figure 8A:
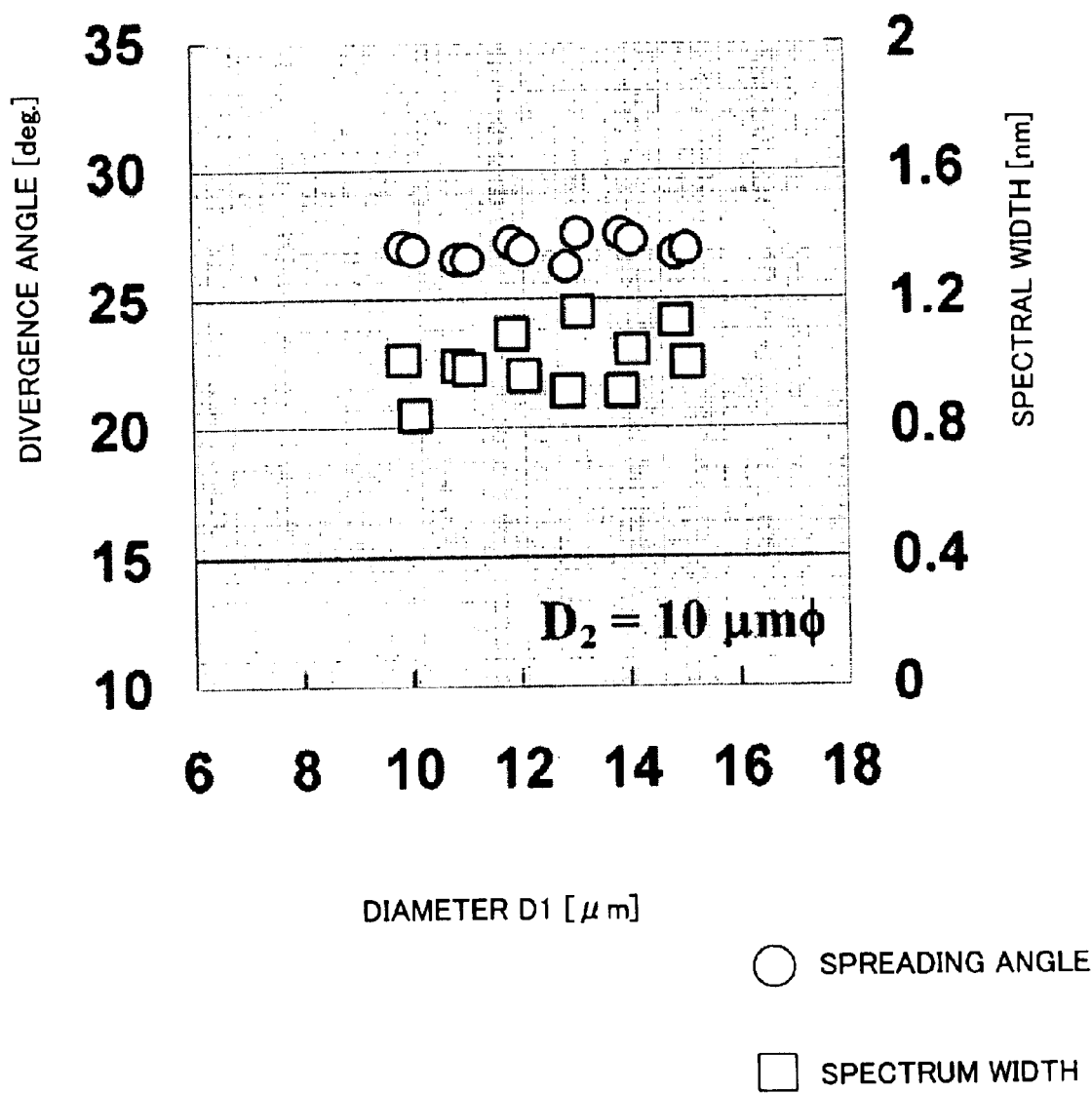
FIGS. 8A and 8B are graphs showing the dependence of the aperture diameter (D1) in the beam divergence angle and the spectral width.
Figure 8B:
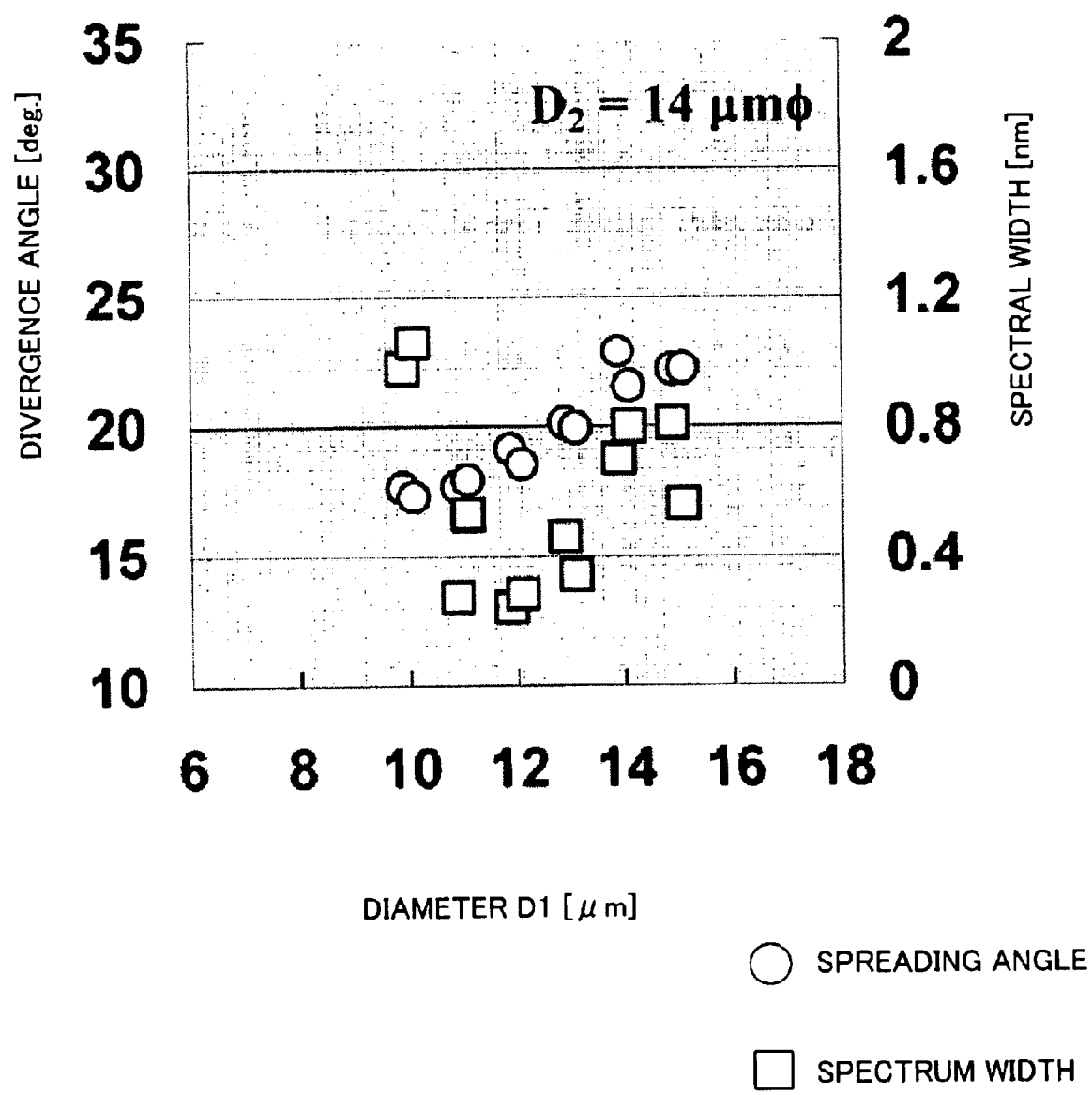

As shown in FIG. 8A, in the case where the diameter D2 of the aperture defined by the optical confinement region 12 is 10 μm, both the beam divergence angle and the spectral width are substantially constant regardless of the change of the aperture diameter D1. This shows that, when the aperture diameter D2 becomes equal to about 10 μm smaller than 12 μm, the beam divergence angle and the spectral width do not depend on the aperture diameter D1 very much. As shown in FIG. 8B, for an aperture diameter D2 of 14 μm, both the beam divergence angle and the spectral width tend to decrease as the aperture diameter D1 decreases.

The change of the spectral width dependent on the aperture diameter D1 is called mode filtering effect and stems from the result of suppression of some oscillation modes contained in the laser light in the multimode oscillation. Some changes of the spectral width associated with the presence/absence of the mode filtering effect are shown in FIGS. 9A, 9B and 9C and FIGS. 10A, 10B and 10C.

Figure 9A:
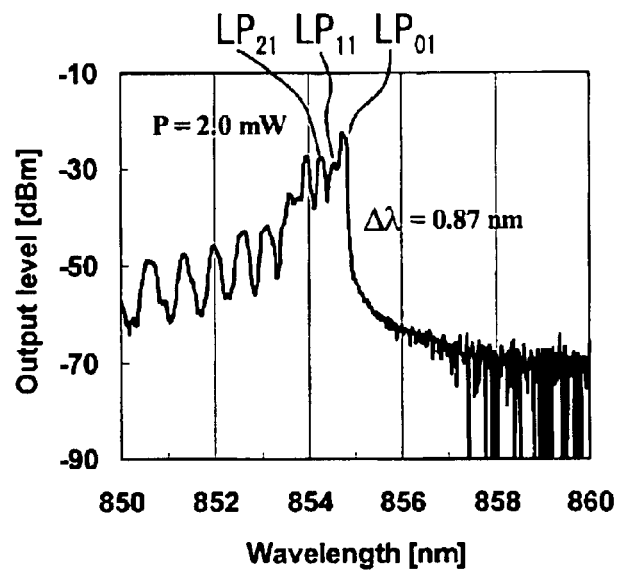
FIGS. 9A, 9B and 9C are graphs showing changes of the spectral width in the presence/absence of the mode filtering effect.
Figure 9B:
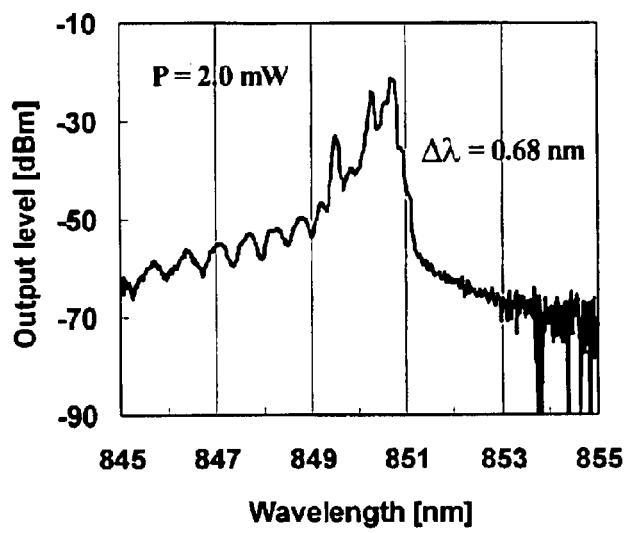
Figure 9C:
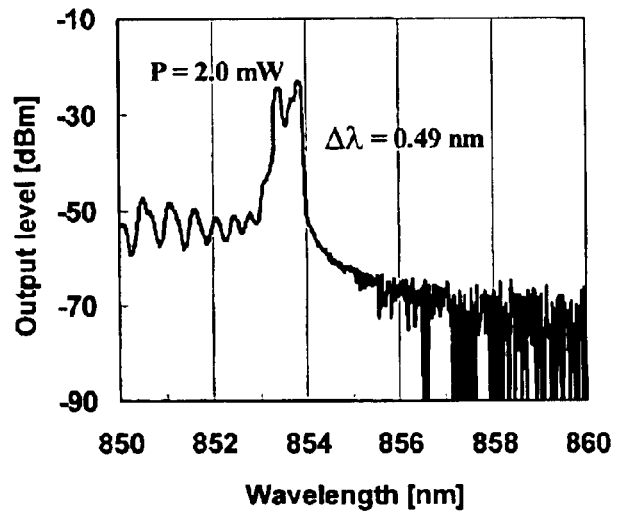
Figure 10A:
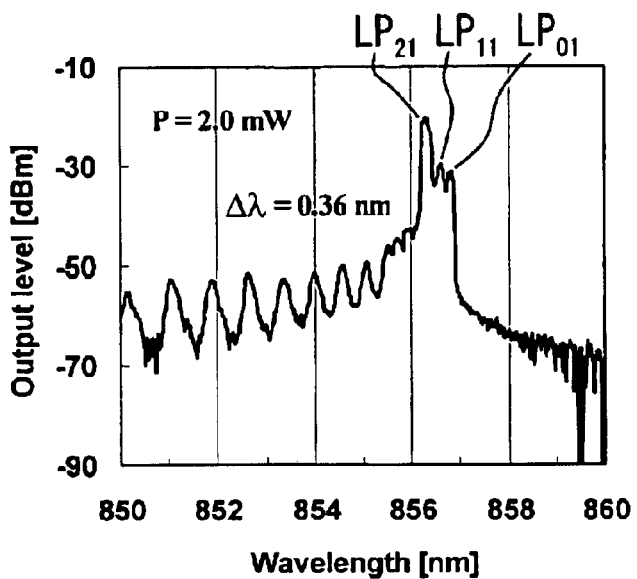
FIGS. 10A, 10B and 10C are graphs showing changes of the spectral widths in the presence/absence of the mode filtering effect.
Figure 10B:
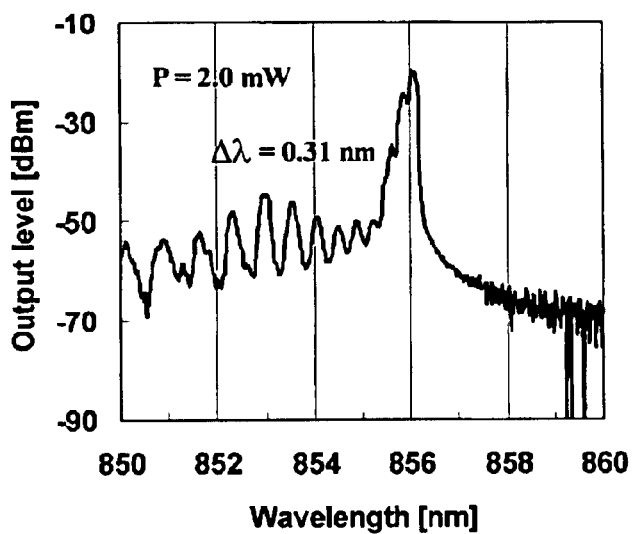
Figure 10C:
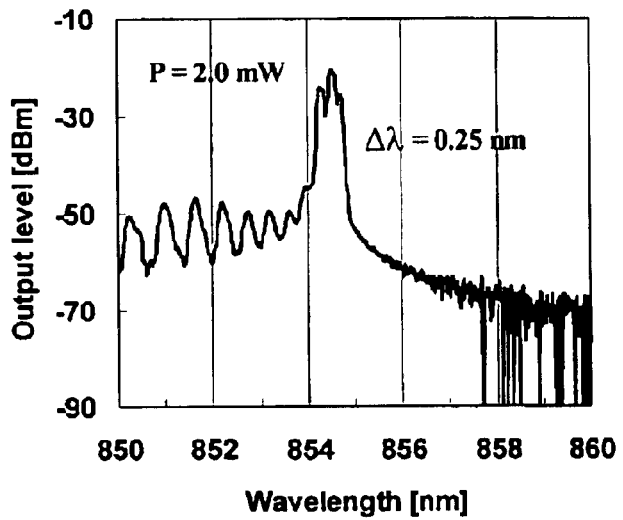

FIG. 9A shows a case where D1=13 μm, and D2=13 μm, and FIG. 9B shows a case where D1=11 μm, and D2=15 μm. FIG. 9C shows a case where D1=12 μm, and D2=15 μm. FIG. 10A shows a case where D1=12 μm, and D2=14 μm, and FIG. 10B shows a case where D1=11 μm, and D2=14 μm. FIG. 10C shows a case where D1=11 μm, and D2=13 μm.

As shown in FIG. 9A, when the aperture diameters D1 and D2 are equal to each other, the spectral width is as large as 0.87 nm, and high-order modes occur with small differences in the output level. As shown in FIG. 9B, when the aperture diameter D1 is 4 μm smaller than the aperture diameter D2, the spectral width decreases to 0.68 nm, and the output levels of the high-order modes decrease. As shown in FIG. 9C, when the aperture diameter D1 is 3 μm smaller than the aperture diameter D2, the spectral width further decreases to 0.49 nm, and the output levels of the zeroth-, first- and second-order modes stand out as compared to the other high-order modes. In this case, there are modes of three different orders in the range from the maximum output level to a level that is 20 dB lower than the maximum output level, while other high-order modes exist out of the range.

As shown in FIG. 10A, when the aperture diameter D1 is 2 μm smaller than the aperture diameter D2, the spectral width decreases to 0.36 nm, and the laser output contains modes of the three consecutive orders (zeroth, first order and second order modes) in the range from the maximum output level to the 20 dB decreased level. Even in the cases of FIGS. 10B and 10C, the spectral widths are equal to 0.31 nm and 0.25 nm, respectively, and the modes of three consecutive orders exist in the given range from the maximum output level. As described above, when the aperture diameter D1 is sufficiently greater than the aperture diameter D2, the spectral width increases as the number of modes increases. On the contrary, when the aperture diameter D1 is gradually decreased, oscillation of higher-order modes is suppressed and the spectral width is reduced.

From the above-mentioned experimental results, it follows that, as the aperture diameter D1 becomes smaller, the beam divergence angle and the spectral width are both decreased, so that the mode stability can be improved and the coupling efficiency can also be improved. However, the preferable numerical relation between the aperture diameters D1 and D2 should be determined taking into consideration the light output closely relating to the high-frequency characteristic in addition to the beam divergence angle and the spectral width. This is why the light output decreases as the aperture diameter D1 decreases, so that improvement in the coupling efficiency may be cancelled.

Figure 11A:
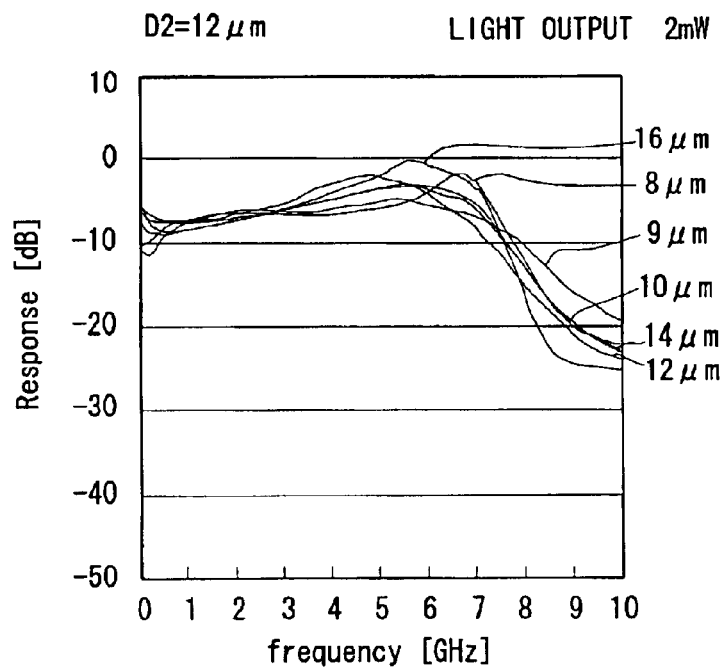
FIGS. 11A and 11B are graphs of the dependence of the aperture angle (D1) in a small-signal frequency response.
Figure 11B:
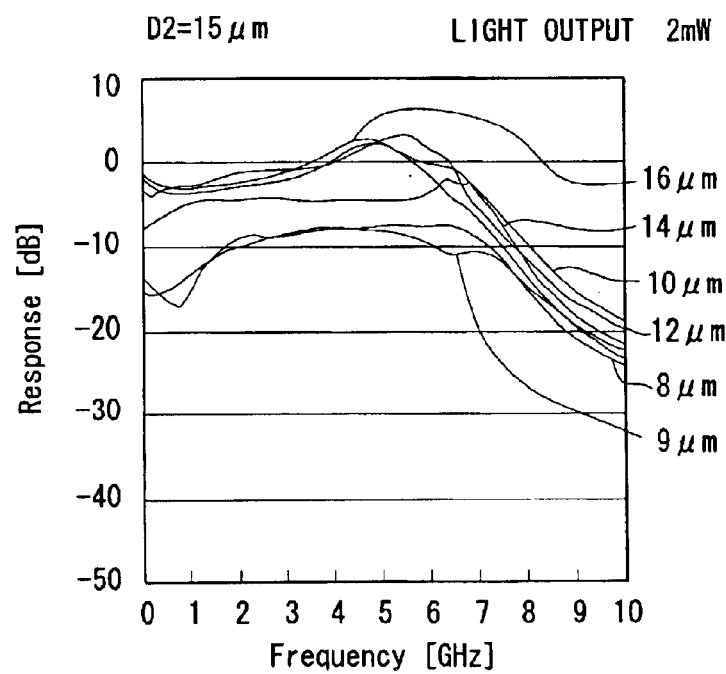

As a reference, the present inventors derive the preferable numerical relation from comparison and evaluation of small-signal frequency response characteristics observed for the same light output. The results of comparison and evaluation are shown in FIGS. 11A and 11B. In a device having an aperture diameter D2 of 12 μm shown in FIG. 11A, the dependence of the aperture diameter D1 is small. Only a small degradation of frequency response is observed when the frequency rises over 7 GHz for a device with the diameter D1 of the aperture in the upper metal layer 9 equal to 16 μm, which is very larger than the diameter D2 of the aperture defined by the optical confinement region 12. In contrast, for a device having an aperture diameter D2 of 15 μm, an explicit degradation of frequency response is observed when the aperture diameter D2 is 8 μm or 9 μm.

When the above results are totally considered, the following can be obtained. Although sufficient reduction in change of the beam divergence angle or spectral width is observed under the condition that D2−D1≧1 μm, the comparison of the small-signal frequency responses shows that a condition where D2−D1≦5 μm is the limit that does not degrade the characteristics. Further, the device resistance obtained at that time is as low as approximately 50 Ω over the whole injection current range, so that the device satisfies requirements of low resistivity.

Second Embodiment

A description will now be given of a surface emitting semiconductor laser device according to a second embodiment of the present invention. In the aforementioned first embodiment of the present invention, the upper electrode 9 formed on the surface of the upper multilayer reflection layer 5 and used for the transverse mode control is utilized for the electrode via which injection current is applied to the device. In contrast, according to the second embodiment of the present invention, an electrode for applying injection current to the device is provided separate from the upper metal layer, which is thus used only for the transverse mode control. Further, rather than the n-side backside electrode 10 provided on the back surface of the substrate 1, an n-side electrode is provided on the front surface thereof. In the following description, parts that are the same as those described in the foregoing are given the same reference numerals.

Figure 2A:
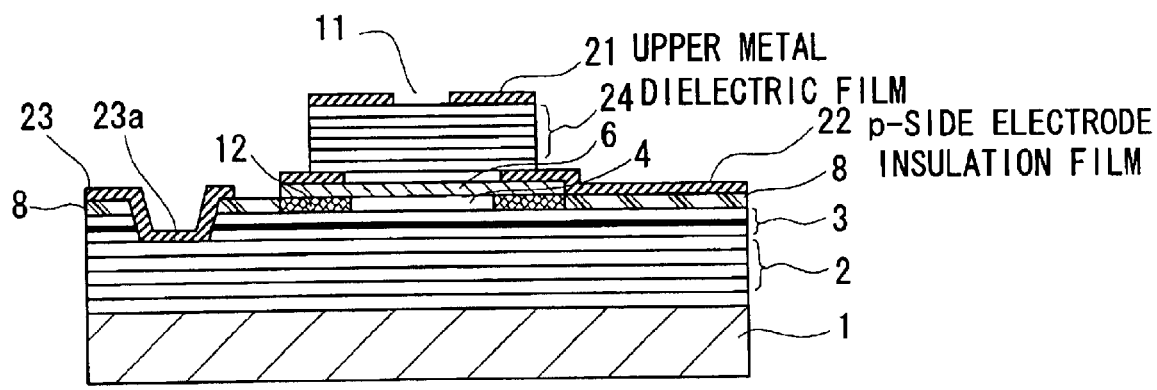
FIG. 2A is a cross-sectional view of a surface emitting semiconductor laser according to a second embodiment of the present invention.

FIG. 2A is a cross-sectional view of a VCSEL according to the second embodiment of the present invention. The VCSEL includes an upper metal layer 21 for the transverse mode control, a p-side electrode 22 and an n-side electrode 23 in addition to the undoped GaAs substrate 1, the n-type lower multilayer reflection layer 2, the undoped active region 3, the p-type AlAs layer 4, the upper multilayer reflection layer 5, the p-type contact layer, the interlayer insulation film 8, the light emission region 11 and the optical confinement region 12.

A laminate ranging from the upper metal layer 21 to the contact layer 6 has a post structure. The p-side electrode 22 is connected between the upper multilayer reflection layer 5 and the contact layer 6 in the post laminate. The p-side electrode 22 extends on the interlayer insulation film 8, and is connected to an electrode pad part for applying injection current to the device. The upper multilayer reflection layer 5 may be formed by etching the multiple semiconductor layers. Alternatively, a dielectric mirror having a laminate of dielectric layers may be provided on the p-side electrode 22.

The n-side electrode 23 is electrically connected to the lower multilayer reflection layer 2 on the substrate 1 via a contact hole 23a formed in the interlayer insulation film 8 and the active region 3. The n-side electrode 23 extending on the interlayer insulation film 8 is connected to another electrode pad part, which is not illustrated for the sake of simplicity. The arrangement in which extraction areas of the p-side and n-side electrodes are provided on the same side makes it easy to provide bonding wires and form metal bumps.

Figure 2B:
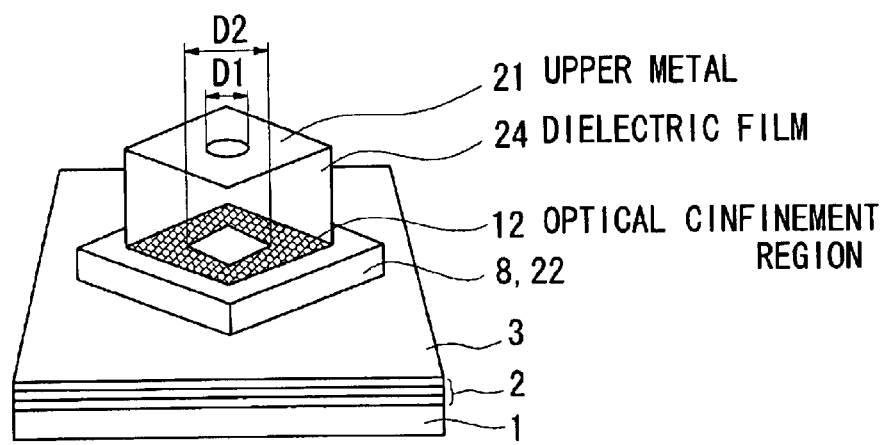
FIG. 2B is a schematic perspective view of the semiconductor laser shown in FIG. 2A.

FIG. 2B is a perspective view of the device shown in FIG. 2A, in which some elements are omitted from illustration in order to see through the internal structure of the device. The second embodiment employs the post structure like a square or rectangular pillar, while the first embodiment employs the post of the cylindrical pillar. An aperture defined by the upper metal layer 21 has a diameter D1, while D2 denotes the diameter of the conductive portion surrounded by the optical confinement region 12. The cross section of the post structure in the direction perpendicular to the axial direction of the post structure has an approximately square shape, and the length of the diagonal line is D2. There is no mutual dependence between design as to the upper electrode 21 should be used to apply injection current and the post shape. There is no essential difference between a variation in which the post of the first embodiment is a square or rectangular pillar and a variation in which the post of the second embodiment is a cylindrical pillar.

Third Embodiment

Figure 3A:
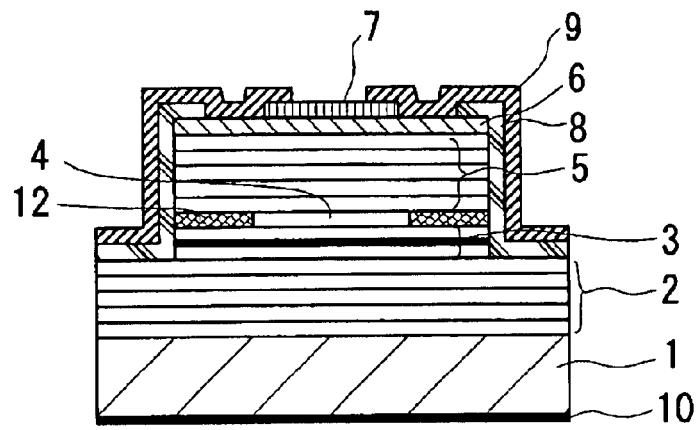
FIG. 3A is a cross-sectional view of a surface emitting semiconductor laser according to a third embodiment of the present invention, the cross-sectional view being taken along a line X2—X2 shown in FIG. 3B.
Figure 3B:
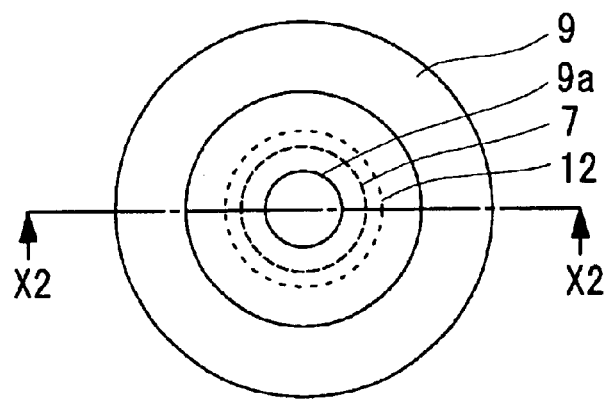
FIG. 3B is a plan view of the semiconductor laser shown in FIG. 3A.
Figure 3C:
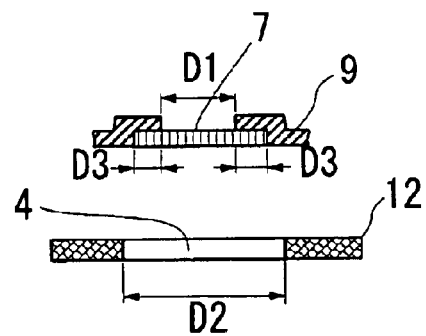
FIG. 3C is a schematic view of parts of the semiconductor laser shown in FIG. 3A.

A description will now be given of a VCSEL according to a third embodiment of the present invention with reference to FIGS. 3A, 3B and 3C. FIG. 3A is a cross-sectional view of the VCSEL, FIG. 3B is a plan view thereof, and FIG. 3C illustrates a relation between apertures in layers. The present embodiment corresponds to a variation of the first embodiment and differs therefrom in the post or laminate structure on the substrate. More particularly, a protection film is provided which protects the surface of the contact layer 6 and supports the transverse mode control. The other portions of the third embodiment are the same as corresponding those of the first embodiment, and are given the same reference numerals as previously.

The protection film 7 is made of dielectric and is provided on the contact layer 6 of the post structure. The protection film 7 has a circular shape, and the center thereof is desirably aligned with the center of the aperture defined by the optical confinement region 12 and the optical axis of the post structure. The outside diameter of the protection film 7 is greater than the diameter D1 of the aperture 9a in the upper electrode 9. An end of the upper electrode 9 extends on the protection film 7. FIG. 3C shows the relation among the aperture (D1) of the upper electrode 9, the protection film 7 and the aperture (D2) defined by the optical confinement region 12. Symbol D3 denotes an overlapping portion in which the end portion of the upper electrode 9 overlaps with the outside edge portion of the protection film 7.

The protection film 7 thus formed plays a role of enhancing the effect of the transverse mode control. More particularly, the reflectivity of the multilayer film in the overlapping portion D3 decreases remarkably, so that the number of modes can effectively be reduced as compared to the transverse mode control by the single layer of the upper metal layer 9.

The width of the overlapping portion D3 has a close relation to the reduced number of modes together with the diameter D1 of the aperture in the upper electrode 9 and the diameter D3 of the aperture defined by the optical confinement region 12. The number of modes tends to decrease as the overlapping length D3 increases. However, when a condition that D2>D1+(2×D3) stands, the effect of reducing the number of modes is rapidly lost. It is therefore required to select an appropriate relation among the three items.

The protection film 7 is provided by the first process after crystal growth. Thus, the protection film 7 functions to prevent the light emission region 11 from being exposed to solution or atmosphere during the process or after the device is completed, and is therefore useful to prevent the laser device from deteriorating.

A description will now be given of the detailed structure of the VCSELs according to the aforementioned embodiments of the present invention and a method of fabricating these VCSELs.

As is shown in FIGS. 1A and 1B, the VCSEL of the first embodiment of the present invention has the lower multilayer reflection layer 2, the active region 3, the p-type AlAs layer 4, the upper multilayer reflection layer 5, and the layer 6, which are laminated on the (100) surface of the n-type GaAs substrate 1 in this order by MOCVD (Metalorganic Chemical Vapor Deposition). The lower multilayer reflection layer 2 includes a multiple laminate of n-type $Al_{0.8}Ga_{0.2}As$ layers and n-$Al_{0.1}Ga_{0.9}As$ layers. The active region 3 is a laminate of a spacer layer, a barrier layer and a quantum well layer. The spacer layer is an undoped $Al_{0.4}Ga_{0.6}As$ layer. The barrier layer is an undoped $Al_{0.2}Ga_{0.8}As$ layer. The quantum well layer is an undoped GaAs layer. The upper multilayer reflection layer 5 includes a multiple laminate of p-type $Al_{0.8}Ga_{0.2}As$ layers and p-$Al_{0.1}Ga_{0.9}As$ layers.

The lower multilayer reflection mirror 2 is made up of multiple pairs of an n-type $Al_{0.9}Ga_{0.1}As$ layer and an n-type $Al_{0.3}Ga_{0.7}As$ layer. Each layer is $\lambda/4n_r$ thick where $\lambda$ is the oscillation wavelength and $n_r$ is the refractive index of the medium. The paired layers having different composition ratios are alternately laminated to a thickness of 36.5 periods. The carrier concentration of the lower multilayer reflection mirror 2 is $3 \times 10^{18}$ cm$^{-3}$ after silicon that is an n-type impurity is doped.

The active region 3 has a laminate in which a quantum well active layer of an undoped GaAs layer having a thickness of 8 nm and a barrier layer of an undoped $Al_{0.2}Ga_{0.8}As$ layer having a thickness of 5 nm are alternately laminated wherein the outer layer is the barrier layer. The above laminate is disposed in the center of the spacer layer that is the undoped $Al_{0.4}Ga_{0.6}As$. The spacer layer including the quantum well active layer and the barrier layer is designed to have a thickness equal to an integral multiple of $\lambda/n_r$ where $\lambda$ is the oscillation wavelength and $n_r$ is the refractive index of the medium. Light having a wavelength of 850 nm is emitted from the active region 3 thus formed.

The upper multilayer reflection mirror 5 is made up of multiple pairs of a p-type $Al_{0.8}Ga_{0.2}As$ layer and a p-type $Al_{0.1}Ga_{0.9}As$ layer. Each layer is $\lambda/4n_r$ thick where $\lambda$ is the oscillation wavelength and $n_r$ is the refractive index of the medium. The paired layers having different composition ratios are alternately laminated to a thickness of 22 periods. This number of periods includes the lower AlAs layer and the upper contact layer 6. As to the AlAs layer 4, it is not necessary to form this layer having the thickness$\lambda/4n_r$ by AlAs only. In contrast, if the AlAs layer is too thick, optical distribution loss may increase. With the above in mind, the AlAs layer 4 is 30 nm thick, and the remaining portion is $Al_{0.9}Ga_{0.1}As$. The carrier concentration of the lower multilayer reflection mirror 5 is $5 \times 10^{18}$ cm$^{-3}$ after carbon that is a p-type impurity is doped.

The reason why the number of periods (number of layers) of the upper multilayer reflection layer 5 is smaller than the lower multilayer reflection layer 2 is that the difference thus formed causes light to be emitted from the upper side of the substrate 1. In order to reduce the series resistance in the posts, practically, an intermediate (graded) layer is interposed between the p-type $Al_{0.9}Ga_{0.1}As$ layer and the p-type $Al_{0.15}Ga_{0.85}As$ layer of the upper multilayer reflection layer 5, the intermediate layer having an Al composition ratio between that of the $Al_{0.8}Ga_{0.2}As$ layer and that of the $Al_{0.1}Ga_{0.9}As$ layer. Such an intermediate layer is not illustrated for the sake of simplicity.

The contact layer 6, which is a p-type GaAs layer, is as thin as 20 nm, and has a carrier concentration of $1 \times 10^{19}$ cm$^{-3}$ after it is doped with zinc serving as the p-type impurity.

The wafer or laser substrate is removed from a growing chamber, the wafer being composed of the lower multilayer reflection mirror 2, the active region 3, the upper multilayer reflection mirror 5 and the contact layer 6 laminated on the semiconductor substrate 1 in this order. Then, the wafer is anisotropically etched so as to form the cylindrical post as shown in FIG. 1B or 1C. The etching depth at that time reaches part of the active region 3. This is because at the time of forming the optical confinement region 12 by a later oxidization process, the side surface of the original AlAs layer 4 is needed to be exposed. The optical confinement region 12 also functions as the current narrowing region. For the selective oxidization laser device, at least the AlAs layer 4 is exposed from the side surface of the post, and the etching depth may go beyond the active region 3 and extend to part of the lower multilayer reflection layer 3.

After the upper multilayer reflection layer 5 is subject to the mesa (post) process mentioned above, the semiconductor substrate 1 is exposed to a water vapor atmosphere having a carrier gas (flow rate: 2 /minute) containing nitrogen at 360° C. for 40 minutes, and is thus oxidized. The AlAs layer 4, which is part of the upper multilayer reflection layer 5m, has a higher rate of oxidization than the $Al_{0.8}Ga_{0.2}As$ layer or $Al_{0.1}Ga_{0.9}As$ layer, which are also parts of the upper multilayer reflection layer 5. Thus, an AlAs oxide region that reflects the shape of the post is formed just above the active region 3, which is part of the post. The remaining non-oxidized region serves as a current injection region or conductive region. That is, the oxidized region is the current narrowing region, and additionally serves as the optical confinement region 12 because it has an optical refractive index approximately equal to half (~1.6) the refractive index of the peripheral semiconductor layers. By the above-mentioned process, the aperture (D2) defined by the optical confinement region 12 can be formed.

After that, an insulation film such as silicon oxide is formed on the front surface of the substrate 1 including the side surface of the post, and is patterned so as to expose only a portion of the contact layer 6 on the post. The insulation film thus formed is the interlayer insulation film 8.

Subsequently, the p-side upper electrode 9 is provided on the top of the post so as to electrically contact the contact layer 6. In order to define the aperture 9a for light emitting or mode control in the center of the upper electrode 9, the upper electrode 9 is removed using a patterned resist film. The aperture 9a thus formed has a circular shape (D1) that reflects the shape of the post.

Finally, the n-side backside electrode 10 is formed on the back surface of the substrate 1, so that the VCSEL shown in FIGS. 1A through 1C can be achieved.

A description will now be given of a method of fabricating the VCSEL according to the second embodiment of the present invention.

As shown in FIGS. 2A and 2B, the VCSEL of the second embodiment of the present invention has the lower multilayer reflection layer 2, the active region 3, the p-type AlAs layer 4, and the layer 6, which are laminated on the (100) surface of the n-type GaAs substrate 1 in this order by MOCVD. The lower multilayer reflection layer 2 includes a laminate of pairs of an n-type $Al_{0.8}Ga_{0.2}As$ layer and an n-$Al_{0.1}Ga_{0.9}As$ layer. The active region 3 is a laminate of a spacer layer, a barrier layer and a quantum well layer. The spacer layer is an undoped $Al_{0.4}Ga_{0.6}As$ layer. The barrier layer is an undoped $Al_{0.2}Ga_{0.8}As$ layer. The quantum well layer is an undoped GaAs layer. The AlAs layer 4 is 20 nm thick and has a carrier concentration of $3 \times 10^{18}$ cm$^{-3}$ after silicon that is an n-type impurity is doped. The p-type GaAs contact layer 6 is 20 nm thick and has a carrier concentration of $1 \times 10^{19}$ cm$^{-3}$ after zinc that is a p-type impurity is doped.

The wafer or laser substrate on which the semiconductor layers are laminated is taken out of the growing chamber, and the laminate is etched so as to have a rectangular pillar shape. In this etching, the etching depth reaches the active region 3 because of the later oxidization process in which the AlAs layer 4 is selectively oxidized from the side surface of the post in order to define the current narrowing/optical confinement region 12.

The rectangular pillar made of the laminate from which the AlAs layer 4 being exposed is then exposed to a moisture atmosphere having a carrier gas (flow rate: 2 l/minute) containing nitrogen at 360° C. for 40 minutes, so that the exposed AlAs layer 4 is thus oxidized from the side surface of the post. This results in the optical confinement region 12. The optical confinement region 12 has an approximately rectangular planer shape viewed from a position immediately above the post, and its diagonal length is shown as the aperture diameter D2 in FIG. 2B.

Thereafter, the insulation film 8 is formed on the front surface of the substrate 1 including the exposed side surface of the post, and is then etched in order to form the p-side and n-side electrodes. More particularly, the insulation film 8 and the active region 3 on the bottom of the post are etched so as to form a contact hole 23a via which the lower multilayer reflection layer 2 is exposed.

Next, the ring-shaped p-side electrode 22 is formed on the top of the post for making an electrical contact with the contact layer 6. Simultaneously, the contact hole 23a is formed in the n-side electrode 23 for making an electrical contact with the lower multilayer reflection layer 2. The diameter of the aperture in the p-side electrode 22 is approximately equal to or larger than that of the aperture defined by the optical confinement region 12.

Then, a dielectric multilayer film 24 of a multiple laminate of $TiO_2$ layers and $SiO_2$ layers is deposited, and the upper multilayer reflection layer 24 is formed in the central portion of the post on the substrate surface by liftoff. Each layer has a thickness of $\lambda/4n_r$ as in the case of the lower multilayer reflection layer 2. The $TiO_2$ layer and the $SiO_2$ layer are laminated one on another to a thickness of ten periods. The number of periods does not include the underlying AlAs layer 4 and the contact layer 6. However, the upper multilayer reflection layer 24 exhibits the function together with the AlAs layer 4 and the contact layer 6.

Finally, the upper metal layer 21 for mode control formed by a single Au layer is formed on the top of the post, and the aperture is formed in the center thereof. Thus, the VCSEL shown in FIGS. 2A and 2B is completed. The upper electrode 21 is not made of Au, but a metal that is capable of reflecting light in the near infrared range well even in the form of a thin film and is defined in the periodic table in the elements may be employed. Examples of such a metal are Ag, Ti, Pt, Ni, Mo, Cr or an alloy thereof.

The VCSEL of the third embodiment of the present invention has the lower multilayer reflection layer 2, the active region 3, the p-type AlAs layer 4, the upper multilayer reflection layer 5, and the layer 6, which are laminated on the (100) surface of the n-type GaAs substrate 1 in this order by MOCVD. The lower multilayer reflection layer 2 includes a laminate of pairs of an n-type $Al_{0.8}Ga_{0.2}As$ layer and an n-$Al_{0.1}Ga_{0.9}As$ layer. The active region 3 is a laminate of a spacer layer, a barrier layer and a quantum well layer. The spacer layer is an undoped $Al_{0.4}Ga_{0.6}As$ layer. The barrier layer is an undoped $Al_{0.2}Ga_{0.8}As$ layer. The quantum well layer is an undoped GaAs layer. The upper multilayer reflection layer 5 includes a laminate of pairs of a p-type $Al_{0.8}Ga_{0.2}As$ layer and a p-$Al_{0.1}Ga_{0.9}As$ layer.

Next, $SiO_2$ is deposited on the whole surface of the substrate 1 by RF sputtering, and is photolithographically formed into a circular shape having a diameter of 14 $\mu$m. The $SiO_2$ film thus shaped is the protection film 7. The steps following the above are the same as those of the first embodiment of the present invention, and a description thereof is omitted here.

Preferably, the protection film 7 has a thickness equal to an integral multiple of $\lambda/2n_r$, by which the emission characteristic is not affected. However, in practice, there is a considerable possibility that the film thickness may happen to be reduced during the process. Further, the reflection characteristic of the resonator may be affected if the eventual film thickness becomes equal to $(2i+1) \lambda/4n_r$ (i: an integer). The thickness of the protection film 7 should be carefully determined taking loss in thickness. When $SiO_2$ is used, the value of $\lambda/4n_r$ is estimated to be approximately 120 nm (in the case of $\lambda$=850 nm). Thus, $SiO_2$ may be deposited to a very small thickness of about 10 nm or a very large thickness of about 240 nm.

In the first and third embodiments of the invention, the upper multilayer reflection layer 5 is of p type, and the lower multilayer reflection layer 2 is of n type. It is possible to interchange the polarities of the reflection layers 2 and 5 and to employ an arrangement such that one of the conduction types is of intrinsic type having low conductivity, assuming an intra-cavity type VCSEL. Generally, there is a worry that the p-type layer has large device resistance due to band discontinuity (forbidden band) and large absorption of light by free carriers (free electrons), as compared to the n-type layer. Therefore, an increased number of layers that form the p-type upper multilayer reflection mirror 5 may degrade the laser characteristics. From the above viewpoints, it is preferable to have a smaller number of layers of the p-type multilayer reflection mirror 5 than that of layers of the n-type multilayer reflection mirror 2.

However, from another viewpoint, the device resistance is inversely proportional to the area. Therefore, the upper multilayer reflection mirror 5 shaped, into the post may serve as a factor that increases the device resistance. It follows that for the same area, it may be preferable to shape the n-type upper multilayer reflection mirror into the post. Consequently, the conduction type of the upper multilayer reflection layer 5 may be determined from all-around view including the direction of emitting, the device resistance and matching with the drive circuit.

In the first through third embodiments of the present invention, the quantum well layer is made of GaAs. However, the quantum well layer is not limited to GaAs but may be made of a III-V compound semiconductor such as AlGaAs, InGaAs or GaInNAs.

In the first through third embodiments of the present invention, MOCVD is used for crystal growth. Alternatively, it is possible to laminate semiconductor layers by another method such as MBE (Molecular Beam Epitaxy).

In the first through third embodiments of the present invention, the upper multilayer reflection layer serves as the emitting layer. It is also possible to incorporate an emitting layer having an incorporated interface region into the lower layer or inner layer by controlling the condition for film growth at the time of forming the upper multilayer reflection layer.

Finally, the aforementioned description of the present invention is summarized as follows.

According to one aspect of the invention, the surface emitting semiconductor laser has: a substrate on which a resonator is formed, the resonator including a lower reflection mirror, an active region, and an upper reflection mirror; a metal layer that is provided on the upper reflection mirror and has a first aperture that defines an outgoing region of laser light generated in the active region; and an optical confinement region that is provided between the metal layer and the lower reflection mirror and has a second aperture that defines a light emission region of the laser light, the second aperture having a diameter equal to or greater than 12 $\mu$m, and the first aperture having a diameter that is 1 to 5 $\mu$m smaller than that of the second aperture, the laser light emitted from the light emission region having a multimode including multiple orders selected within a predetermined wavelength range.

The difference between the diameter D1 of the first aperture of the metal layer and the diameter D2 of the second aperture defined by the optical confinement region 12 is set to an appropriate value, that is, the former is 1 to 5 $\mu$m smaller than the latter. This controls the transverse mode of the emitted laser light and stabilizes the multimode laser oscillation. In other words, the first aperture of the metal layer suppresses light emission of particular modes. This is based on the principle in which a spot of a particular oscillation mode generated in the light emission region is shut out by the light outgoing region (first aperture). This increases optical loss and finally suppresses the particular mode of oscillation. When the diameter of the second aperture is set equal to or larger than 12 $\mu$m, it is possible to reduce the threshold current and stabilize laser light of multimode oscillation and to suppress the beam divergence angle and spectral width thereof within a given range. This suppresses decrease of the efficiency of coupling with the optical fiber.

The metal layer may be made of a material that is a kind of metal defined in the periodic table in the elements. A kind of metal is known as a material that reflects light in the near-infrared range even in the form of thin film, and is preferably used as material for reflecting light. The apertures may have a circular, ellipse, rectangular, square or polygonal shape when the apertures are illustrated in two-dimensional expression. The diameters of the apertures may be defined as the maximum-length straight line connecting two points on the planer shape thereof. Alternatively, the diameters of the apertures may be defines as the average of straight lines each connecting two points on the planer shape thereof.

The optical confinement region may include a material having a refractive index lower than refractive indexes of materials that form the upper and lower reflection mirrors. The optical confinement region thus configured forms a refractive index waveguide path. This forms the optical aperture for defining the emission region between the metal layer and the lower reflection mirror. Laser of the refractive index waveguide type has a high frequency response at the time of high-speed modulation.

The optical confinement region has the function of narrowing current. In other words, the optical confinement region may include a current narrowing region containing an oxidized high-resistance portion. By utilizing the semiconductor oxidization technique for formation of the optical confinement region, not only the refractive index but also the conductivity of the region can be reduced. The oxidized region is an insulation region for current narrowing/optical confinement. Preferably, the semiconductor layer that is subject to oxidization is made of AlAs or AlGaAs. Selective oxidization of the semiconductor layer results in the $Al_2O_3$ base insulation or high-resistance region. It is thus possible to realize high slope efficiency and low threshold current due to the effective current narrowing.

It is preferable that the multimode is a linearly polarized mode and includes the first-order mode or higher therein. The multimode includes multiple orders of laser light within a given wavelength range, and a suppressed spectral width and beam divergence angle. It is therefore possible to efficiently transfer the light signal without decreasing the efficiency of coupling with the optical fiber.

The surface emitting semiconductor laser may include a post structure extending from the upper reflection mirror to the optical confinement region. The optical confinement region includes a region defined by selectively oxidizing the post from a side surface thereof. An oxidized region thus formed defining the diameter of the second aperture. The second aperture of the optical confinement region in the post structure is preferably an oxidized region due to oxidization that advances inwards from the side surface of the post.

When the post structure is like a cylindrical pillar, the first and second apertures are preferably of a circular shape. Besides, the first and second apertures may have a pillar having a cross section of a rectangular, polygonal, or ellipse shape. When the first and second apertures have a cylindrical pillar (its planer shape has a circular or ellipse shape), the center of the post structure may easily be aligned with the central axes of the apertures. There is an additional advantage in that the distance of oxidization from the side surface of the post can be evened easily and the second aperture may be defined precisely.

The lower reflection mirror may include multiple semiconductor layers of a first conduction type, and the upper reflection mirror includes multiple semiconductor layers of a second conduction type. The metal layer is electrically connected to the upper reflection mirror and serves as an electrode via which current is supplied to the upper reflection mirror. The metal layer serves as an electrode for injection of current for laser oscillation and also controls the transverse mode of laser light emitted. The upper reflection mirror may include a contact layer having a high impurity concentration in order to reduce the resistance of the connection with the metal layer, which makes an ohmic contact with the contact layer. The metal layer may be made of an alloy of multiple metals or a laminate of metal layers. The metal layer may contain at least one of metals selected from the group of Au, Ag, Pt, Ti, Ni, Mo and Cr.

The surface emitting semiconductor laser may further include a first electrode layer interposed between the upper reflection mirror and the optical confinement region, and the first electrode layer has a third aperture aligned with the second aperture defined by the optical confinement region.

The upper reflection mirror may include a dielectric mirror, which is laminated on the first electrode layer. By providing the dielectric mirror of the post or pillar shape on the first electrode layer, it is possible to realize a lower post height than that of another type of post obtained by etching multiple semiconductor layers to thus define the post structure. The post with the dielectric mirror may be produced by a comparatively easy process including etching.

The surface emitting semiconductor laser may be configured so as to further include a protection layer of a dielectric material provided on the upper reflection mirror, wherein the protection layer has a diameter larger than that of the first aperture of the metal layer, and an end portion of the metal layer is located on an outside edge portion of the protection layer. The protection layer on the upper reflection mirror protects the surface of the mirror from contamination and corrosion resulting from atmosphere and etchant. Since the protection layer is made of dielectric, the reflectance of the mirror decreases significantly in a position where the end portion of the metal layer overlaps the protection layer. This efficiently reduces the number of modes, as compared to the case where the transverse mode is controlled by the metal layer alone. An example of the dielectric protection layer is a silicon oxide layer, and desirably has a diameter smaller than that of the second aperture defined by the optical confinement region.

The surface emitting semiconductor laser may be configured so that: the upper reflection mirror includes a contact layer having a comparatively high impurity concentration; and the metal layer is electrically connected to the contact layer. It is thus possible to extract the electrodes of the different conduction types from the same surface of the substrate and facilitate wire bonding and making connections with bumps. The laser device may be mounted with flip-chip connection. When the substrate is made of a semiconductor substance, an electrode may be provided on the backside thereof.

According to another aspect of the present invention, the surface emitting semiconductor laser includes: a substrate; a first semiconductor reflection layer of a first conduction type provided on the substrate; an active region for generating laser light provided on the first semiconductor reflection layer; a second semiconductor reflection layer of a second conduction type provided on the active region; a metal layer that is provided on the second semiconductor reflection layer and has an aperture via which the laser light is emitted; and a current narrowing region that is interposed between the first and second reflection layers and a conductive portion surrounded by a high-resistance portion, the aperture of the metal layer being smaller than the conductive portion of the current narrowing region, the aperture of the metal layer and the conductive portion of the current narrowing region having sizes that allows the laser light of multimode emitted via the aperture of the metal layer, the multimode containing, in addition to an order of interest, at most two orders other than the order of interest generating a light output larger than those of other orders within a range from a maximum output level of laser light of the order of interest to a level that is 20 dB lower than the maximum output level.

With this structure, it is possible to realize a laser device that has improved efficiency of emission and frequency response and stably emits high-power laser light with a low threshold current. The device may be coupled with the optical fiber without considerable attenuation and is suitable for an optical source for multimode optical fibers.

Preferably, the laser is of selective oxidization type, and the high-resistance portion of the current narrowing region is an oxide region obtained by selectively oxidizing the post from the side surface thereof. The conductive portion is surrounded by the oxidized region. The current narrowing region may be an AlAs layer or AlGaAs layer. A III-V semiconductor material other than the above may be used for the current narrowing region.

The multimode may include laser light that oscillates in zeroth-order, first-order and second-order modes. Also, the multimode may include laser light that oscillates in the first-order or second-order mode having the largest light output. Preferably, when the conductive portion of the current narrowing region is set equal to 12 $\mu$m to 15 $\mu$m and the aperture of the metal layer is set equal to 11 to 12 $\mu$m, excellent mode-controlled laser light can be obtained.

The laser light of multiple orders contained in the multimode has a spectral width equal to or smaller than 0.5 nm. The spectral width can be obtained by subjecting multiple orders of laser light to the RMS method. A spectral width of 0.5 nm realizes an optical source for highly efficient multimode-type optical fibers having a small number of code errors due to pulse spreading and a high transmission capability.

The aperture of the metal layer has a diameter that is 3 $\mu$m smaller than that defining a size of the conductive layer in the current narrowing region. This setting enables emission of multimode-oscillated laser light and realizes low resistance and high power while maintaining high frequency response.

According to yet another aspect of the present invention, the surface emitting semiconductor laser includes: a substrate; a first semiconductor reflection layer of a first conduction type provided on the substrate; an active region that is provided on the first semiconductor reflection layer and generates laser light; a second semiconductor reflection layer of a second conduction type provided on the active region; a metal layer that is provided on the second semiconductor reflection layer and has an aperture via which the laser light is emitted; and a current narrowing region that is provided between the first and second semiconductor reflection layers and has a conductive portion surrounded by a high-resistance portion, the conductive portion having a diameter equal to or larger than 12 $\mu$m, the aperture of the metal layer having a diameter that is at least 1 $\mu$m smaller than that of the conductive portion and allowing the laser light of multimode. With the above structure, it is possible to reduce the beam divergence angle of laser light emitted from the aperture of the metal layer and to thus reduce attenuation of laser in such a situation that the laser device is coupled to an optical fiber as an optical source of optical communications.

Preferably, the laser beam has a beam divergence angle of 23 degrees or smaller. When the diameter of the conductive portion of the current narrowing region is approximately 10 $\mu$m, the beam divergence angle is not improved greatly even if the aperture of the metal layer is reduced by 1 $\mu$m.

Preferably, the laser light emitted via the aperture may oscillate in the multimode, and contain lights oscillating in zeroth, first and second order modes. Even for multimode laser, the beam divergence angle can be reduced, so that the laser device thus configured is useful for the optical source of the multimode type optical fiber.

The present invention is not limited to the specifically disclosed embodiments, and other embodiments, variations and modifications may be made without departing from the scope of the present invention.

What is claimed is:

1. A surface emitting semiconductor laser comprising:
   a substrate on which a resonator is formed, the resonator including a lower reflection mirror, an active region, and an upper reflection mirror;
   a metal layer that is provided on the upper reflection mirror and has a first aperture that defines an outgoing region of laser light generated in the active region; and
   an optical confinement region that is provided between the metal layer and the lower reflection mirror and has a second aperture that defines a light emission region of the laser light,
   the second aperture having a diameter equal to or greater than 12 $\mu$m, and the first aperture having a diameter that is 1 to 5 $\mu$m smaller than that of the second aperture,
   the laser light emitted from the light emission region having a multimode including multiple orders selected within a predetermined wavelength range.

2. The surface emitting semiconductor laser as claimed in claim 1, wherein the optical confinement region comprises a material having a refractive index lower than refractive indexes of materials that form the upper and lower reflection mirrors.

3. The surface emitting semiconductor laser as claimed in claim 1, wherein the optical confinement region comprises a current narrowing region containing an oxidized high-resistance portion.

4. The surface emitting semiconductor laser as claimed in claim 1, wherein:
   the surface emitting semiconductor laser comprises a post structure extending from the upper reflection mirror to the optical confinement region;
   the optical confinement region includes a region defined by selectively oxidizing the post from a side surface thereof, and
   an oxidized region thus formed defines the diameter of the second aperture.

5. The surface emitting semiconductor laser as claimed in claim 1, wherein:
   the lower reflection mirror includes multiple semiconductor layers of a first conduction type;
   the upper reflection mirror includes multiple semiconductor layers of a second conduction type; and
   the metal layer is electrically connected to the upper reflection mirror and serves as an electrode via which current is supplied to the upper reflection mirror.

6. The surface emitting semiconductor laser as claimed in claim 1, further comprising a first electrode layer interposed between the upper reflection mirror and the optical confinement region,
   the first electrode layer having a third aperture aligned with the second aperture of the optical confinement region.

7. The surface emitting semiconductor laser as claimed in claim 6, wherein the upper reflection mirror comprises a dielectric mirror, which is laminated on the first electrode layer.

8. The surface emitting semiconductor laser as claimed in claim 1, further comprising a protection layer of a dielectric material provided on the upper reflection mirror, wherein the protection layer has a diameter larger than that of the first aperture of the metal layer, and an end portion of the metal layer is located on an outside edge portion of the protection layer.

9. The surface emitting semiconductor laser as claimed in claim 1, wherein:

the upper reflection mirror includes a contact layer having a comparatively high impurity concentration; and the metal layer is electrically connected to the contact layer.

10. The surface emitting semiconductor laser as claimed in claim 8, further comprising a second electrode provided on the substrate, the second electrode being electrically connected to the lower reflection mirror of the first conduction type.

11. The surface emitting semiconductor laser as claimed in claim 1, wherein the metal layer comprises a metal material containing at least one of Au, Ag, Pt, Ti, Ni, Mo and Cr.

12. A surface emitting semiconductor laser comprising:

a substrate;

a first semiconductor reflection layer of a first conduction type provided on the substrate;

an active region for generating laser light provided on the first semiconductor reflection layer;

a second semiconductor reflection layer of a second conduction type provided on the active region;

a metal layer that is provided on the second semiconductor reflection layer and has an aperture via which the laser light goes out; and a current narrowing region that is interposed between the first and second reflection layers and a conductive portion surrounded by a high-resistance portion, the aperture of the metal layer being smaller than the conductive portion of the current narrowing region, the aperture of the metal layer and the conductive portion of the current narrowing region having sizes that allows the laser light of multimode emitted via the aperture of the metal layer, the multimode containing, in addition to an order of interest, at most two orders other than the order of interest generating a light output larger than those of other orders within a range from a maximum output level of laser light of the order of interest to a level that is 20 dB lower than the maximum output level.

13. The surface emitting semiconductor laser as claimed in claim 12, wherein the multimode includes laser light that oscillates in zeroth, first and second order modes.

14. The surface emitting semiconductor laser as claimed in claim 13, wherein the multimode includes laser light that oscillates in the second-order mode having the largest light output.

15. The surface emitting semiconductor laser as claimed in claim 12, wherein the laser light of the multimode has a spectral width equal to or smaller than 0.5 nm.

16. The surface emitting semiconductor laser as claimed in claim 15, wherein the aperture of the metal layer has a diameter that is 3 $\mu$m smaller than that defining a size of the conductive layer in the current narrowing region.

17. A surface emitting semiconductor laser comprising:

a substrate;

a first semiconductor reflection layer of a first conduction type provided on the substrate;

an active region that is provided on the first semiconductor reflection layer and generates laser light;

a second semiconductor reflection layer of a second conduction type provided on the active region;

a metal layer that is provided on the second semiconductor reflection layer and has an aperture via which the laser light is emitted; and a current narrowing region that is provided between the first and second semiconductor reflection layers and has a conductive portion surrounded by a high-resistance portion, the conductive portion having a diameter equal to or larger than 12 $\mu$m, the aperture of the metal layer having a diameter that is at least 1 $\mu$m smaller than that of the conductive portion and allowing the laser light of multimode.

18. The surface emitting semiconductor laser as claimed in claim 17, wherein:

the laser light emitted via the aperture oscillates in the multimode, and contains lights oscillating in zeroth, first and second order modes.

19. The surface emitting semiconductor laser as claimed in claim 1, wherein the diameter of the second aperture is in a range from 12 $\mu$m to 15 $\mu$m.

20. The surface emitting semiconductor laser as claimed in claim 17, wherein the diameter of the conductive portion is in a range from 12 $\mu$m to 15 $\mu$m.

* * * * *